United States Patent
Weitzel et al.

[11] Patent Number: 5,956,578
[45] Date of Patent: Sep. 21, 1999

[54] METHOD OF FABRICATING VERTICAL FET WITH SCHOTTKY DIODE

[75] Inventors: Charles E. Weitzel, Mesa; Christine Thero, Scottsdale; Mohit Bhatnagar, Chandler, all of Ariz.

[73] Assignee: Motorola, Inc., Schaumburg, Ill.

[21] Appl. No.: 08/839,226

[22] Filed: Apr. 23, 1997

[51] Int. Cl.⁶ .................................................. H01L 21/332
[52] U.S. Cl. .......................................... 438/138; 438/570
[58] Field of Search ...................... 438/173, 176, 438/186, 192, 135, 136, 137, 138, 570; 257/135, 195, 267, 263, 328, 280, 476

[56] References Cited

U.S. PATENT DOCUMENTS 5,818,084 10/1998 Williams et al. ...................... 257/329

*Primary Examiner*—Tuan H. Nguyen
*Attorney, Agent, or Firm*—Eugene A. Parsons; Robert F. Hightower; William E. Koch

[57] ABSTRACT

A method of fabricating an integrated VFET and Schottky diode including forming a source region on the upper surface of a substrate so as to define a channel. First and second spaced apart gates are formed on opposing sides of the source region so as to abut the channel, thereby forming a channel structure. Schottky metal is positioned on the upper surface of the substrate proximate the channel structure to define a Schottky diode region and form a Schottky diode. A source contact is formed in communication with the source region and the Schottky metal, and a drain contact is formed on the lower surface of the substrate.

16 Claims, 1 Drawing Sheet

METHOD OF FABRICATING VERTICAL FET WITH SCHOTTKY DIODE

FIELD OF THE INVENTION

The present invention pertains to Schottky diodes and more specifically to a method of integrating a Schottky diode with a vertical field effect transistors.

BACKGROUND OF THE INVENTION

Field effect transistors (FETs) are often combined with Schottky diodes in electronic circuits for synchronizing and the like. For example, in synchronous rectification applications, e.g. in DC to DC power supplies, current conducting diodes are needed because the current waveform applied to the FET is not always perfectly synchronized to the gate drive waveform. Current practice is to use a discrete diode and connect it in parallel to the FET and included in a common package. Employing discrete diodes results in relatively large size, weight, cost, and device parasitics. The relatively large parasitics result in poor switching speeds.

An alternate approach that is beginning to be used in silicon MOSFET technology is to use a silicon Schottky diode integrated with a silicon double diffused metal on semiconductor field effect transistor (DMOSFET). See for example U.S. Pat. No. 4,811,065, entitled "Power DMOS Transistor With High Speed Body Diode", issued Mar. 7, 1989. The difficulty here is that the double diffusion process is limited to a silicon semiconductor material.

It would be highly advantageous, therefore, to remedy the foregoing and other deficiencies inherent in the prior art.

Accordingly, it is an object of the present invention to provide an integrated vertical field effect transistor and Schottky diode.

Another object of the invention is to provide an integrated vertical field effect transistor and Schottky diode which has reduced size, weight, cost, and device parasitics.

And another object of the invention is to provide a method of fabricating an integrated vertical field effect transistor and Schottky diode.

Yet another object of the present invention is to provide a method of fabricating an integrated vertical field effect transistor and Schottky diode without increasing fabrication steps.

And yet another object of the present invention is to provide a method of fabricating an integrated vertical field effect transistor and Schottky diode in improved semiconductor materials.

SUMMARY OF THE INVENTION

Briefly, to achieve the desired objects of the instant invention in accordance with a preferred embodiment thereof, provided is a method of fabricating an integrated VFET and Schottky diode including forming a source region on the upper surface of a substrate so as to define a channel. First and second spaced apart gates are formed on opposing sides of the source region so as to abut the channel, thereby forming a channel structure. Schottky metal is positioned on the upper surface of the substrate proximate the channel structure to define a Schottky diode region and form a Schottky diode. A source contact is formed in communication with the source region and the Schottky metal, and a drain contact is formed on the lower surface of the substrate.

In a specific aspect, the substrate includes a substrate selected from a group including GaAs, SiC, GaN, InP, other group III–V materials and various combinations thereof.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DESCRIPTION OF THE PREFERRED EMBODIMENTS

Figures 1, 2, 3:
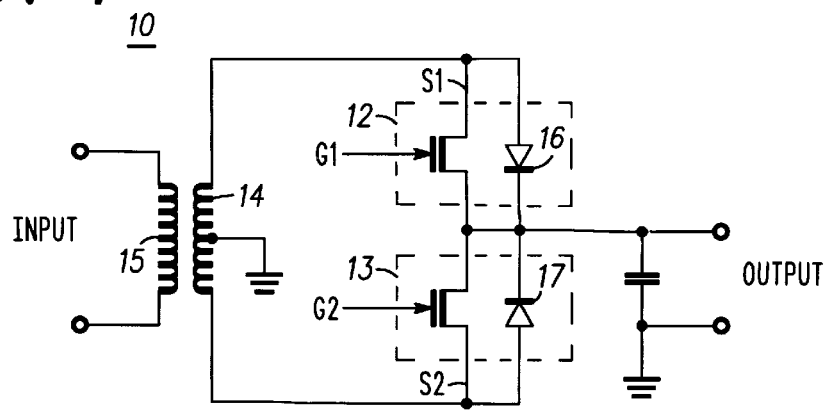
FIG. 1 is a schematic diagram illustrating a use of integrated vertical field effect transistors and Schottky diodes.
FIG. 2 is a simplified cross sectional view of an integrated vertical field effect transistor and Schottky diode in accordance with the present invention.
FIG. 3 is a simplified cross sectional view of another embodiment of integrated vertical field effect transistors and a Schottky diode.

Turning now to the drawings in which like reference characters indicate corresponding elements throughout the several views, attention is first directed to FIG. 1 which illustrates a power supply 10 for synchronous rectification. Power supply 10 includes integrated vertical field effect transistors (VFETs) 12 and 13 connected in series across a secondary winding 14 of a power transformer, a primary winding 15 of which is the input to the power supply. A pair of diodes 16 and 17 are connected in parallel across VFETs 12 and 13, respectively. The center of secondary winding 14 is grounded to form a reference for the output and output power is available at the junction of VFETs 12 and 13 and diodes 16 and 17.

Generally, for optimum operation of power supply 10, diodes 16 and 17 need to be fast switching and have minimal reverse recovery loss. Furthermore, diodes 16 and 17 are required to have the same breakdown voltage ratings as the FETs and a related current rating.

Turning now to FIG. 2, a simplified cross sectional view is illustrated of an integrated device 20 including a vertical field effect transistor 22 and Schottky diode 23. Device 20 includes a substrate 24 having a supporting substrate 25 and a drift layer 27 formed on the upper surface of supporting substrate 25. In this preferred embodiment, supporting substrate 25 is an n+ type semiconductor material and layer 27 is a lightly doped, n−, type epitaxial layer. The thickness and doping of layer 27 is dependent on specific device requirements. It should be understood that in this embodiment substrate 24 can be a single layer or a plurality of layers, depending on the specific application and materials. Substrate 24, including supporting substrate 25 and epitaxial layer 27, has an upper surface 28 and an opposed lower surface 29. Substrate 24, as will be explained presently, also supports diode 23.

An epitaxial layer is formed on surface 28 of substrate 24 and implanted and patterned to define a source region 30. A source metal 31 is formed on source region 30 and may be used to pattern source region 30 and to operate as a self aligning mask for gate implants. Source region 30 also defines a channel 32 therebelow. In this specific embodiment, gate regions 34 and 35 are implanted on opposing sides of source region 30 so as to abut channel 32 thereby forming a channel structure. Ohmic contacts 37 and 38 are formed on gates 34 and 35 by any convenient metal processing technology. A dielectric layer 40 is deposited overlying ohmic contacts 37 and 38 and abutting sides of source 30 and source metal 31. Dielectric layer 40 is patterned to expose a portion of surface 28 of substrate 24 proximate the channel structure. Schottky metal 42 is deposited on the exposed portion of surface 28 to define a Schottky diode region thereby forming Schottky diode 23. A source contact is deposited over dielectric 40 in communication with source region 30 through source metal 31, and Schottky metal 42. A drain contact 45 is formed on opposed lower surface 29 of substrate 24. Gate metal 37 and 38 is exposed in selected areas for contacting.

Thus device 20 includes a VFET 22 and Schottky diode 23 which are formed on the same substrate (epitaxial layer 27) with no additional processing steps. This integration eliminates the cost of hybridizing discrete devices and substantially reduces parasitics (resistance, inductance and capacitance components). These reductions in parasitics increase the switching speed of device 20. Furthermore, Schottky diode 23 can be easily adapted so that the current rating is appropriately related to VFET 22 as, for example, by adjusting the total surface areas. Preferably, the current rating of Schottky diode 23 is in a range of approximately 0.1–0.2 times the current rating of VFET 22 (channel structure).

Referring to FIG. 3, an integrated device, generally designate 49, including a power vertical field effect transistor (VFET) 50 and a Schottky diode 51, is illustrated. VFET 50 includes a plurality of channel structures 52, 53 and 54, etc. In the preferred embodiment, ten channel structures are employed in power VFET 50. Each channel structure is substantially similar, therefore only one (52) will be discussed in detail for convenience. Channel structure 52 includes a substrate 55 which may include a supporting substrate and one or more epitaxial layers (not shown) as described in conjunction with the previous embodiment. Substrate 55, as will be understood by those skilled in the art, also supports a plurality of similar channel structures making up power FET 50.

A source region 60 is formed by implanting a source species in the upper surface of substrate 55. The source region 60 is n+ in this preferred embodiment and is formed by implanting Si+ to lower the contact resistance of the source metal. A metal mask (not shown) such as TiW is formed on source contact region 30 and defined by some convenient means such as a reactive ion etch. The metal mask is employed to etch first and second spaced apart gate trenches 62, each having sidewalls and a bottom, in the upper surface of substrate 55 on opposing sides of source region 60 so as to define a channel 63 underlying source region 60. Some convenient means is used to form trenches 62, such as reactive ion etch (RIE) or damage free electron cyclotron resonance (ECR) etching, which are employed to etch clean, straight sidewalls to a depth in a range of approximately 3 KÅ–7 KÅ.

In the specific example of a GaAs substrate, implanting carbon into gallium arsenide to form p-type regions is not feasible because the activation of carbon in GaAs is only 5%. However, by using a co-implant with carbon the activation can reach 70%. There are two different types of co-implants that can be used. The first type is an implant that is electrically inactive in GaAs, such as argon or krypton (noble gasses), but causes lattice damage (vacancies). The damage allows the carbon to diffuse more readily. The carbon can then attach itself to arsenic sites where it acts as an acceptor. The second type is an implant from Group III that is electrically active such as aluminum, gallium or indium. In this case the co-implant attaches itself to gallium lattice sites thus opening up more arsenic sites. The arsenic sites are then occupied by carbon which again acts as an acceptor. The second type of implant also induces lattice site damage allowing the co-implant to help increase carbon activation in two ways: lattice site occupation and lattice damage. Carbon and a lattice damaging species are co-implanted to form gates 65 in the bottoms of trenches 62.

It is important that channel 63 be short for vertical FET operation at low operating voltages. If channel 63 is too wide, a large gate voltage is necessary to pinch off power VFET 50. This gate voltage gets subtracted from the blocking voltage of power VFET 50 to determine the drain to source breakdown voltage rating. Channel region 63 has a width less than approximately 1.5 µm and preferably is in a range of approximately 0.8–1.2 µm with source region 60 being in a range of 0.5–0.8 µm.

Previous demonstrations of GaAs vertical FETs with implanted gates use beryllium or magnesium as the gate electrode. However, the lateral diffusion of these dopants during annealing makes it impossible to scale the gate pitch below 4 µm. Carbon implants have a diffusivity that is three orders of magnitude lower than Be, Zn and Cd, during the thermal anneal needed for implant activation. With carbon implants and co-implants, as used in the present embodiment, the gate pitch is limited only by lithography and can easily be scaled down to the 2.5 µm range.

All implants are activated simultaneously using a rapid thermal anneal (800–900° C., 10–30 seconds). Specifically, source region 60 and gate regions 65 are annealed to activate the source species, and carbon. NiGeAu, WSi, NiGeW or other suitable metal is deposited to form source contact 67 in electrical contact with source region 60 and a dielectric layer 68 is deposited in trenches 62 to insulate gates 65 from subsequent metalizations, which will become apparent presently. Electrical contact with gates 65 are made through a grid of gate leads (not shown) in a structure which is disclosed in a U.S. patent application entitled "GaAs Vertical FET", filed of even date herewith, and bearing attorney docket no. CR96-261. A drain contact (not shown) is deposited on the rear surface of substrate 55 as described above in conjunction with FIG. 2.

Still referring to FIG. 3, Schottky diode 51, included in integrated device 49, is formed by depositing a layer 70 of Schottky metal in electrical communication with source contact 67 and a diode region 71 proximate channel structures 52, 53, 54, etc. Schottky metal layer 70 is deposited in contact with an exposed upper surface of substrate 55 and is selected to form a Schottky diode in conjunction with the material system of the substrate. Some typical examples of Schottky metal to be used in conjunction with a GaAs substrate are titanium, aluminum, platinum and combinations thereof, etc. It should be noted that the surface area of diode region 71 can be adjusted so as to be much smaller than the total VFET area, surface area of all the channels (i.e. channel 63) of the channel structures. As an example the surface area of diode region 71 is generally equal to the surface area of one channel 63 and therefore, to provide a diode current rating of 0.1–0.2 times the VFET current rating, 5–10 channel structures are employed for every Schottky diode.

Thus provided is an integrated vertical field effect transistor and Schottky diode which has reduced size, weight, cost, and device parasitics. Further provided is a method of fabricating an integrated vertical field effect transistor and Schottky diode without increasing fabrication steps and with improved semiconductor materials such as GaAs, SiC, GaN and InP.

Various modifications and changes to the embodiments herein chosen for purposes of illustration will readily occur to those skilled in the art. Various modifications and variations may be made by those skilled in the art without departing from the scope of the invention as defined by the following claims.

Having fully described and disclosed the present invention and preferred embodiments thereof in such clear and concise terms as to enable those skilled in the art to understand and practice same, the invention claimed is:

What is claimed is:

1. A method of fabricating an integrated vertical field effect transistor and Schottky diode comprising the steps of:

providing a substrate having a first surface and an opposed second surface;

forming a source region on the first surface of the substrate so as to define a channel therebelow;

forming first and second spaced apart gates on opposing sides of the source region so as to abut the channel thereby forming a channel structure;

positioning Schottky metal on the first surface of the substrate proximate the channel structure to define a Schottky diode region and form a Schottky diode;

forming a source contact in communication with the source region and the Schottky metal; and forming a drain contact on the second surface of the substrate.

2. A method as claimed in claim 1 wherein the step of providing the substrate includes providing a substrate selected from a group including GaAs, SiC, GaN and InP.

3. A method as claimed in claim 1 wherein the step of forming the source contact includes using Schottky metal.

4. A method as claimed in claim 1 wherein the step of forming the channel includes forming the channel with a current rating, and the step of forming the Schottky diode includes forming the Schottky diode with a current rating 0.1–0.2 times the current rating of the channel.

5. A method as claimed in claim 1 further including the step of forming a field plate in communication with the source on the first surface of the substrate and extending toward the Schottky diode.

6. A method as claimed in claim 1 wherein the steps of forming the gates and source region further comprise the steps of:

implanting a source species to form the source region in the first surface of the substrate;

forming first and second spaced apart gate trenches, each having sidewalls and a bottom, in the first surface of the substrate on opposing sides of the source region so as to define the channel underlying the source region;

co-implanting carbon and a lattice damaging species to form gates in the bottoms of the first and second trenches; and forming gate contacts in communication with the gates.

7. A method of fabricating an integrated vertical field effect transistor and Schottky diode comprising the steps of:

providing a substrate having a first surface and an opposed second surface selected from a group including GaAs, SiC, GaN and InP;

implanting a source species to form a source region in the first surface of the substrate so as to define a channel therebelow;

forming first and second spaced apart gates on opposing sides of the source region so as to abut the channel thereby forming a channel structure;

positioning Schottky metal on the first surface of the substrate proximate the channel structure to define a Schottky diode region and form a Schottky diode;

forming a source contact in communication with the source region and the Schottky metal; and forming a drain contact on the second surface of the substrate.

8. A method as claimed in claim 7 wherein the step of forming first and second gates includes the steps of:

forming first and second spaced apart gate trenches, each having sidewalls and a bottom, in the first surface of the substrate on opposing sides of the source region so as to define the channel underlying the source region;

co-implanting carbon and a lattice damaging species to form gates in the bottoms of the first and second trenches; and forming gate contacts in communication with the gates.

9. A method as claimed in claim 7 wherein the step of forming first and second gates includes the step of implanting first and second spaced apart gates on opposing sides of the source region so as to define the channel underlying the source region.

10. A method as claimed in claim 7 wherein the step of forming the source contact includes using Schottky metal.

11. A method as claimed in claim 7 wherein the step of forming the channel structure includes forming the channel structure with a current rating, and the step of forming the Schottky diode includes forming the Schottky diode with a current rating 0.1–0.2 times the current rating of the channel structure.

12. A method as claimed in claim 7 further including the step of forming a field plate in communication with the source on the first surface of the substrate and extending toward the Schottky diode.

13. A method of fabricating a plurality of integrated vertical field effect transistors and a Schottky diode comprising the steps of:

providing a substrate having a first surface and an opposed second surface;

forming a plurality of spaced apart source regions on the first surface of the substrate, each source region defining a channel therebelow;

forming a plurality of spaced apart gates, each source region having a gate on opposing sides of the source region so as to abut the channel;

positioning Schottky metal on the first surface of the substrate to define a Schottky diode;

forming a source contact in communication with the source region and the Schottky metal; and forming a drain contact on the second surface of the substrate.

14. A method as claimed in claim 13 wherein the step of providing the substrate includes providing a substrate selected from a group including GaAs, SiC, GaN and InP.

15. A method as claimed in claim 13 wherein the step of forming spaced apart source regions includes forming the channel with a current rating, and the step of positioning Schottky metal includes forming the Schottky diode with a current rating 0.1–0.2 times the current rating of the channel.

16. A method as claimed in claim 13 wherein the steps of forming the gates and source regions further comprise the steps of:

implanting a source species to form the source regions in the first surface of the substrate;

forming a plurality of spaced apart gate trenches, each having sidewalls and a bottom, in the first surface of the substrate, each of the source regions having a gate trench on opposing sides so as to define the channel underlying the source region;

co-implanting carbon and a lattice damaging species to form gales in the bottoms of each of the plurality of trenches; and forming a plurality of gate contacts, each in communication with a gate.

* * * * *